(12) United States Patent
Reiss et al.

(10) Patent No.: US 9,764,945 B2
(45) Date of Patent: Sep. 19, 2017

(54) MICROMECHANICAL COMPONENT AND CORRESPONDING TEST METHOD FOR A MICROMECHANICAL COMPONENT

(71) Applicant: Robert Bosch GmbH, Stuttgart (DE)

(72) Inventors: Sebastian Reiss, Reutlingen (DE); Simon Armbruster, Wannweil (DE); Helmut Grutzeck, Kusterdingen (DE); Joerg Muchow, Reutlingen (DE); Frederic Njikam Njimonzie, Reutlingen (DE); Johannes Baader, Wannweil (DE); Rainer Straub, Ammerbuch (DE); Wolfgang Heinzelmann, Kirchentellinsfurt (DE)

(73) Assignee: ROBERT BOSCH GMBH, Stuttgart (DE)

( * ) Notice: Subject to any disclaimer, the term of this patent is extended or adjusted under 35 U.S.C. 154(b) by 314 days.

(21) Appl. No.: 14/471,436

(22) Filed: Aug. 28, 2014

(65) Prior Publication Data

US 2015/0061695 A1    Mar. 5, 2015

(30) Foreign Application Priority Data

Aug. 28, 2013   (DE) ........................ 10 2013 217 094

(51) Int. Cl.
*B81B 7/00*    (2006.01)
*B81C 99/00*   (2010.01)

(52) U.S. Cl.
CPC .......... *B81B 7/0019* (2013.01); *B81C 99/005* (2013.01); *B81B 2201/042* (2013.01)

(58) Field of Classification Search
USPC .......... 324/549, 537, 500, 613; 73/727, 774; 29/25.35
See application file for complete search history.

(56) References Cited

U.S. PATENT DOCUMENTS 6,539,798 B1 *    4/2003   Geiger .................... G01P 15/06
                                                          216/2
2006/0176125 A1 * 8/2006   Morita ................ H03H 3/0077
                                                          333/186

(Continued)

FOREIGN PATENT DOCUMENTS

DE    10 2008 000 030    7/2009

OTHER PUBLICATIONS

Pinter Stefan, Micromechanical component and a method for operating a micromechanical component, Jun. 3, 2010, Application No. 10-2011-0082158, Robert Bosch GMBH, G02B26/08.*

*Primary Examiner* — Melissa Koval
*Assistant Examiner* — Nasima Monsur
(74) *Attorney, Agent, or Firm* — Norton Rose Fulbright US LLP; Gerard Messina

(57) ABSTRACT

A micromechanical component and a corresponding test method for a micromechanical component are described. The micromechanical component includes at least one first region, which is elastically connected to a second region via a spring device, a resistor element, which is situated in and/or on the spring device and is at least partially interruptible in the event of damage to the spring device, and a detection device, which is electrically connected to the resistor element, for detecting an interruption in the resistor element and for generating a corresponding detection signal.

15 Claims, 4 Drawing Sheets

(56) References Cited

U.S. PATENT DOCUMENTS

| | | | |
|---|---|---|---|
| 2006/0289415 A1* | 12/2006 | Muehlheim | B81B 7/0012 |
| | | | 219/209 |
| 2011/0292529 A1* | 12/2011 | Lindenkreuz | B81B 3/0086 |
| | | | 359/872 |
| 2012/0031183 A1* | 2/2012 | Neul | G01C 19/5755 |
| | | | 73/504.02 |
| 2012/0125117 A1* | 5/2012 | Njikam Njimonzie | G02B 26/0833 |
| | | | 73/777 |

* cited by examiner

MICROMECHANICAL COMPONENT AND CORRESPONDING TEST METHOD FOR A MICROMECHANICAL COMPONENT

FIELD OF THE INVENTION

The present invention relates to a micromechanical component and a corresponding test method for a micromechanical component.

BACKGROUND INFORMATION

The present invention and the problems on which it is based are explained here with respect to MEMS micromirror arrays, although, in principle, the present invention may be applied to any micromechanical components.

German Published Patent Application No. 10 2008 000 030 describes a manufacturing method for a micromechanical electrostatic adjusting device and a corresponding micromechanical electrostatic adjusting device, a mirror element being mounted via springs on a stationary region.

During operation or in the event of an overload, MEMS micromirrors may suffer damage in the form of cracks and/or breaks. If it cannot be detected promptly, such damage may cause safety-relevant problems for humans and machines.

To prevent such risks, it has been proposed that a monitoring method should be provided for detection of damage to such MEMS micromirror arrays.

For example, with MEMS micromirror arrays or with other MEMS structures, for example, actuators or sensors, optical monitoring units may be built into the overall module. The change in a beam of light reflected by the movable MEMS structure may be recorded by a photodiode. In the event of damage, signal changes in the photodiode are detected and transmitted to a monitoring ASIC. The ASIC then ensures an emergency cutoff or shutdown of a light source, for example, a laser light source.

If the micromechanical component includes a detection component in the form of a piezoresistive bridge circuit, the resistor element according to the present invention may be implemented by the fact that the detection component leads past a sensitive spot in the micromechanical component, which results in it being interrupted if damaged. In this case, the damage incident would be noticeable immediately due to loss of the detection signal, for example, the bridge output voltage.

SUMMARY

The idea on which the present invention is based involves the configuration of a resistor element in the form of an implanted piezoresistive resistor, for example, or an applied metallic resistor along a sensitive spring of a micromechanical component.

A metal resistor may be made of copper, aluminum or other metal alloys, for example. Also possible are a salicided resistor, a polysilicon conducting resistor or a resistor made of epitactically deposited polysilicon on the spring device of the micromechanical component.

In the event of damage such as breakage or cracking of the spring device, for example, the voltage applied to the resistor element or the current flowing through it undergoes a drastic change. The change in current or voltage may be picked up by an ammeter or a voltmeter. The corresponding detection signal may be relayed to an ASIC for triggering an emergency shutdown or for shutting down a light source.

One important advantage of using the resistor element according to the present invention in comparison with an essentially known analysis circuit, which analyzes the change in optical signals over time to infer a fault by analysis of a change in frequency components, for example, lies in the speed of detection of a break. Another advantage is the easy implementability in the overall process.

According to a preferred specific embodiment, the first region is a stationary region and the second region is an elastically deflectable mirror region.

According to another preferred specific embodiment, the first region is an elastically deflectable drive region and the second region is an elastically deflectable mirror region.

According to another preferred specific embodiment, the resistor element passes over the first region, so that it is interruptible even in the event of damage in the first region. This also permits continuous monitoring of the first region.

According to another preferred specific embodiment, the resistor element meanders over the first region. This increases the region for monitoring.

According to another preferred specific embodiment, the resistor element is connected to the detection device via the first region.

According to another preferred specific embodiment, the detection device is configured to detect the temperature via the resistor element. The resistor element may thus also be used simultaneously as a temperature sensor element integrated into the chip. In this case, the temperature coefficient is utilized for the temperature measurement. It should be pointed out that the temperature coefficient of an applied metal resistor is generally much lower than that of a diffused piezoresistive resistor.

According to another preferred specific embodiment, the detection device is configured to carry out a measurement of light intensity via the resistor element. The resistor element may thus at the same time also be used as a light sensor element integrated into the chip. The photo-effect of the doped semiconductor is utilized here. It should be pointed out that an applied metal resistor has no photo-effect.

According to another preferred specific embodiment, the spring device has a first section and a second section, the resistor element being formed in different ways in the first section and in the second section and being wired to the detection device in such a way that the detection device supplies a first detection signal when the resistor element is interrupted in the first section and supplies a second detection signal, which is different from the first detection signal, when the resistor element is interrupted in the second section. Local failure analyses or warnings may thus be output in this way.

According to another preferred specific embodiment, the detection device is designed for wireless transmission of the detection signal externally, in particular to a cell phone. A fault may be transmitted from the detection device wirelessly, for example, for display of the fault on an external display, for example, the display screen on a cell phone. Transmission of the fault by SMS or e-mail to the manufacturer to point out defects, risks or abuse is possible in order to carry out statistical analyses, if necessary.

DETAILED DESCRIPTION

Figure 1:
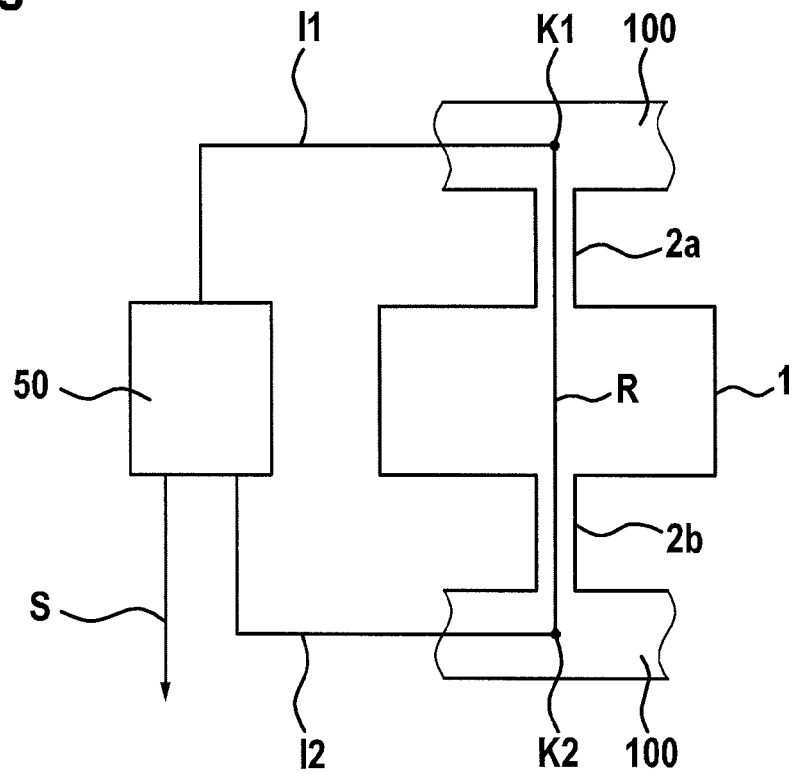
FIG. 1 shows a schematic cross-sectional diagram to illustrate a test method for a micromechanical component and a corresponding micromechanical component according to a first specific embodiment of the present invention.

The same reference numerals in the figures denote the same elements or those having the same function.

FIG. 1 is a schematic cross-sectional diagram to illustrate a test method for a micromechanical component and a corresponding micromechanical component according to a first specific embodiment of the present invention.

Reference numeral 1 in FIG. 1 denotes a micromechanical micromirror region, which is connected via springs 2a, 2b to a stationary region 100, for example, a substrate region. Diffused into the material of regions 1, 100 and of springs 2a, 2b, e.g., silicon, between nodes K1 and K2, is a piezoresistive resistor R in the form of a narrow strip.

Nodes K1, K2 are connected via printed electrical conductors I1, I2 to an electrical detection device 50. Detection device 50 includes a voltage source and an ammeter, for example, which are connected in series with printed conductors I1, I2.

In the event of a break or a partial break in springs 2a, 2b, the amperage detected by the ammeter undergoes a significant change, whereupon a corresponding detection signal S may be generated.

Detection signal S may cause an emergency cutoff or shutdown of a laser source (not shown), for example, which is aimed at micromirror region 1.

Wireless transmission externally to a smartphone or to some other cell phone for display of detection signal S, for example, is also possible.

A crack, i.e., a break, in micromirror region 1 may also be detected in the respective region since resistor element R is also guided over micromirror region 1.

Figure 2:
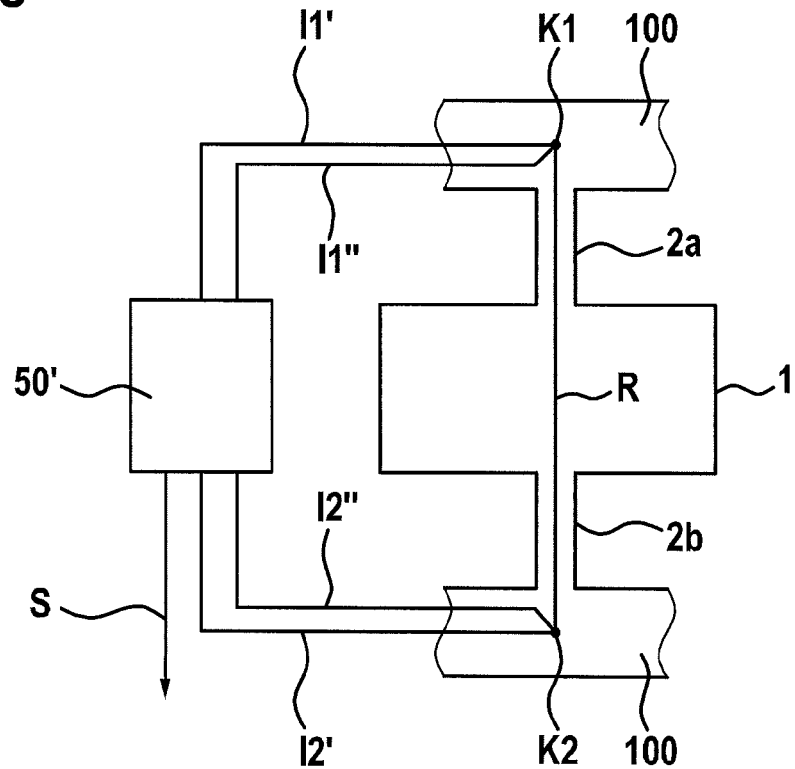
FIG. 2 shows a schematic cross-sectional diagram to illustrate a test method for a micromechanical component and a corresponding micromechanical component according to a second specific embodiment of the present invention.

FIG. 2 shows a schematic cross-sectional diagram to illustrate a test method for a micromechanical component and a corresponding micromechanical component according to a second specific embodiment of the present invention.

In the second specific embodiment according to FIG. 2, two printed conductors are applied to nodes K1, K2, namely, printed conductors I1', I1' being applied to first node K1, and printed conductors I2', I2" being applied to second node K2.

Detection device 50' in this case includes a current source, which supplies a current through resistor element R via printed conductors I1', I2'. In addition, detection device 50' includes a voltmeter, which measures a voltage drop across resistor element R via printed conductors I1" and I2".

In the event of a break or a crack in springs 2a, 2b or micromirror region 1, detection signal S may be generated via the detected change in voltage.

Figure 3:
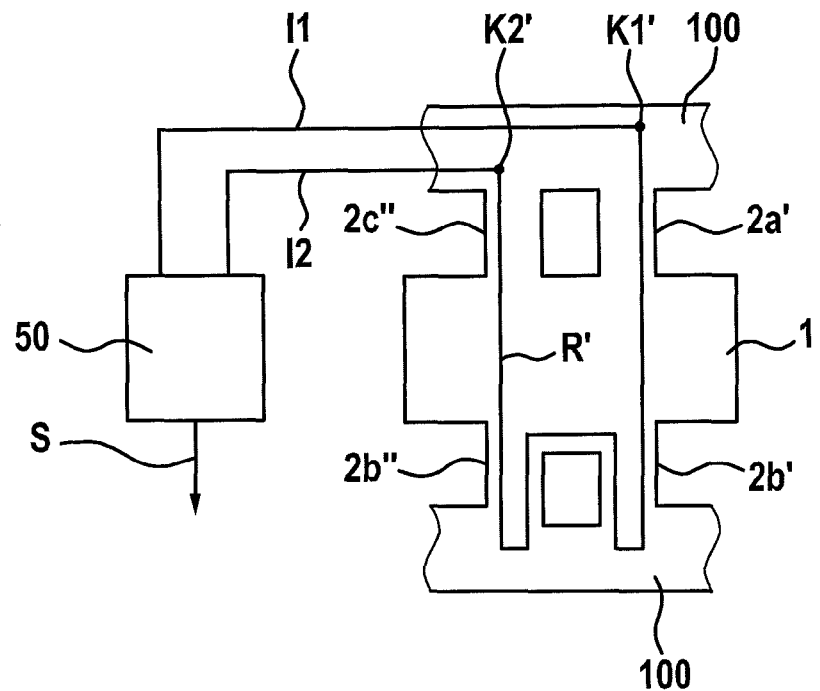
FIG. 3 shows a schematic cross-sectional diagram to illustrate a test method for a micromechanical component and a corresponding micromechanical component according to a third specific embodiment of the present invention.

FIG. 3 shows a schematic cross-sectional diagram to illustrate a test method for a micromechanical component and a corresponding micromechanical component according to a third specific embodiment of the present invention.

In the third specific embodiment according to FIG. 3, micromirror region 1 is connected to stationary region 100 at opposite sides via two parallel springs 2a', 2a" and 2b', 2b".

In this case, resistor element R' runs between nodes K1', K2', both of which are on the upper side of stationary region 100 shown in FIG. 3.

Resistor element R' may be a diffused or sputtered resistor, for example, which runs from node K1' via spring 2a' and micromirror region 1 to spring 2b' and from there back via spring 2b' and mirror region 1 to spring 2b", after which it reverses direction and runs back via spring 2b" and micromirror region 1 to spring 2a" and from there to node K2'.

As in the first specific embodiment, detection device 50 has a voltage source and an ammeter connected in series with it for generating detection signal S in the event of damage.

Figure 4:
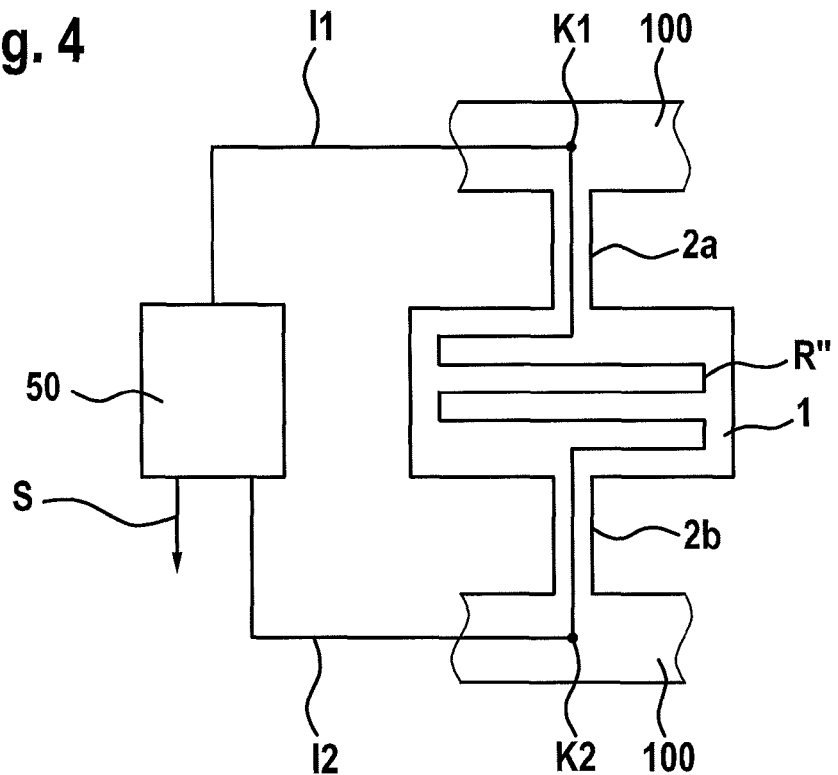
FIG. 4 shows a schematic cross-sectional diagram to illustrate a test method for a micromechanical component and a corresponding micromechanical component according to a fourth specific embodiment of the present invention.

FIG. 4 shows a schematic cross-sectional diagram to illustrate a test method for a micromechanical component and a corresponding micromechanical component according to a fourth specific embodiment of the present invention.

In the fourth specific embodiment according to FIG. 4, in contrast with the first specific embodiment according to FIG. 1, a piezoresistive resistor R", which has a meandering configuration in the region of the micromirror region, is provided, so that detection of a crack or break may also be accomplished by detection device 50 over a large surface in this region 1.

The design is otherwise the same as that in the first specific embodiment.

Figure 5:
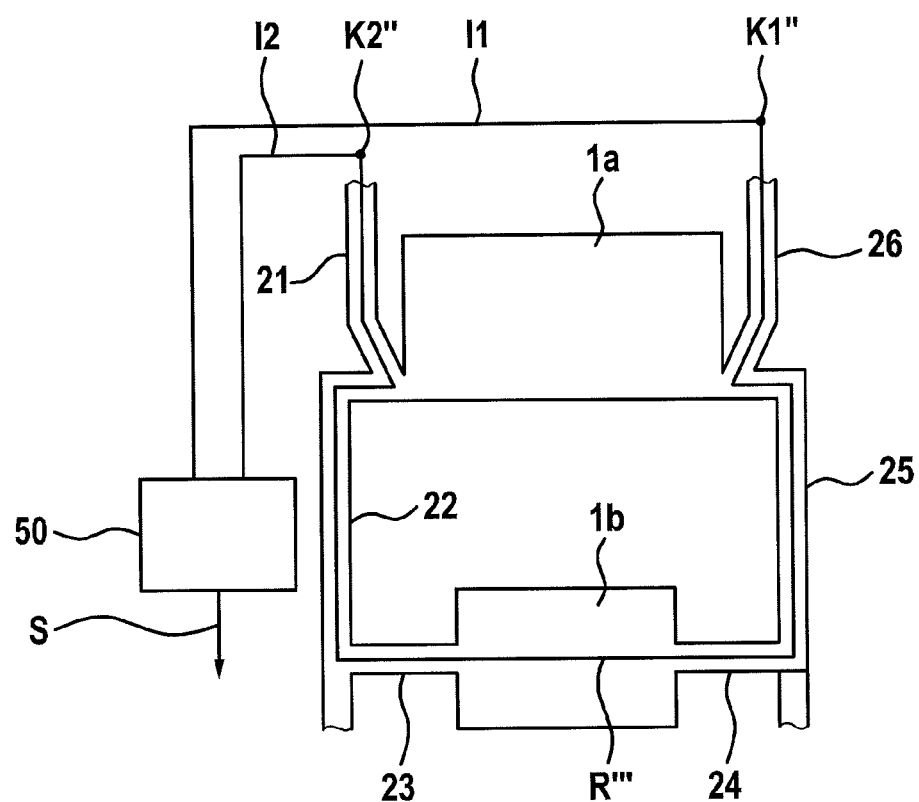
FIG. 5 shows a schematic cross-sectional diagram to illustrate a test method for a micromechanical component and a corresponding micromechanical component according to a fifth specific embodiment of the present invention.

FIG. 5 shows a schematic cross-sectional diagram to illustrate a test method for a micromechanical component and a corresponding micromechanical component according to a fifth specific embodiment of the present invention.

In the fifth specific embodiment according to FIG. 5, a first region 1a, which functions as the drive region, and a second region 1b, which functions as the micromirror region, are provided.

Drive region 1a is connected via springs 21, 26 to a stationary substrate region (not shown). Drive region 1a may be deflected with respect to the substrate region by a coil device, for example (not shown), which is provided thereon, and elastically restored via springs 21, 26. Micromirror region 1b is connected to drive region 1a via a first section including springs 22, 23 and via a second section including springs 24, 25. Micromirror region 1b may be deflected elastically by driver region 1a due to a resonant effect.

A piezoresistive resistor element R' is formed, starting from a first node K1", via springs 26, 25, 24, micromirror region 1b and springs 23, 22, 21, leading to node K2". Nodes K1", K2" are connected to evaluation device 50 via printed conductors I1, I2, the evaluation device being formed as in the first exemplary embodiment described above.

Due to this configuration, a break in springs 21 through 26 or in micromirror region 1b is detectable by the evaluation device.

Figure 6:
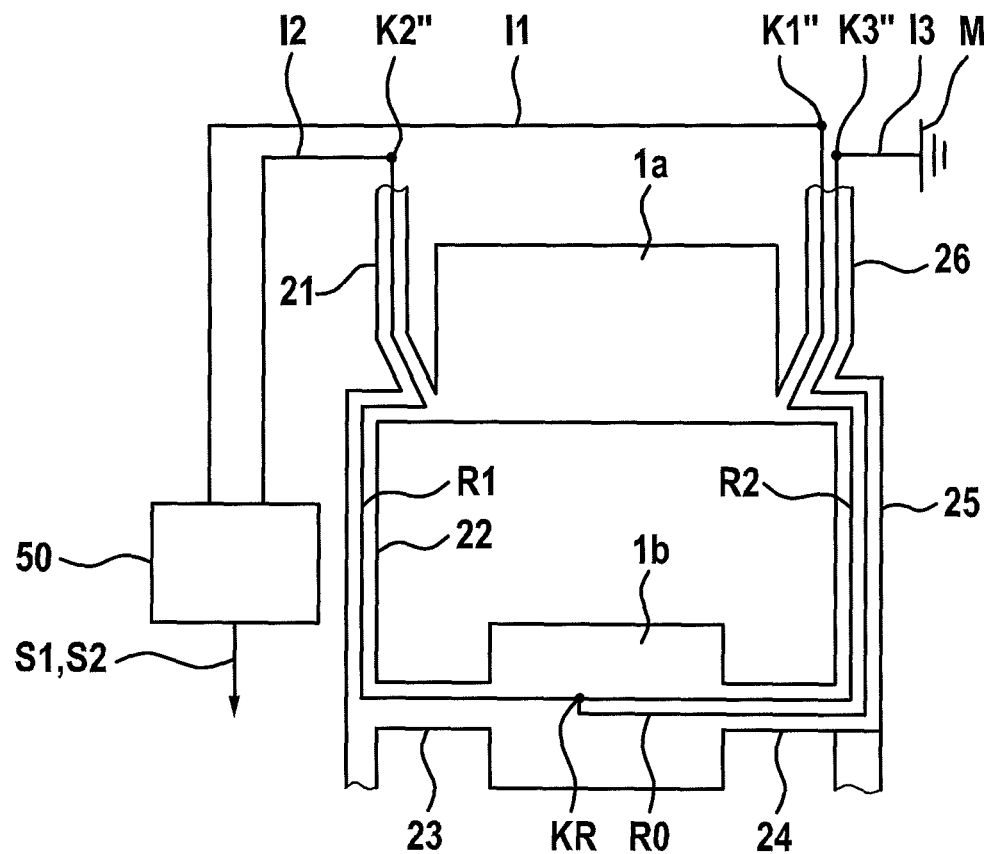
FIG. 6 shows a schematic cross-sectional diagram to illustrate a test method for a micromechanical component and a corresponding micromechanical component according to a sixth specific embodiment of the present invention.

FIG. 6 shows a schematic cross-sectional diagram to illustrate a test method for a micromechanical component and a corresponding micromechanical component according to a sixth specific embodiment of the present invention.

In the sixth specific embodiment according to FIG. 6, a first resistor R1 is formed between node K2" and node K1, sitting on micromirror region 1b. A second resistor R2, which has a different resistance value than the resistance value for R1, is formed between node K1" and node KR.

A third resistor R0, which is connected to a ground potential M via a printed conductor I3, is formed in parallel to resistor R2, starting from node K3" and leading to node KR.

In this specific embodiment, a break or a crack in the region of the first section including springs 21, 22, 23 may be differentiated from a break in the second section including springs 24, 25, 26 since different changes in current are thereby generated in the ammeter of evaluation device 50.

Different detection signals S1, S2 may thus be generated in the first spring region and the second spring region, depending on the damage.

This may be used by the user or the manufacturer for diagnostic purposes, for example, and for a statistical analysis of occurring faults.

Although the present invention has been explained on the basis of micromirror arrays, it is not limited to them but instead may also be applied to other micromechanical components including spring elements, for example, sensors or actuators.

The geometries depicted here are intended only as examples and may be varied arbitrarily.

What is claimed is:

1. A micromechanical component, comprising:
    at least one first region, wherein the at least one first region includes at least one of a stationary region and an elastically deflectable drive region;
    a second region, wherein the second region is an elastically deflectable mirror region;
    a spring device via which the first region is connected elastically to the second region;
    a resistor element situated at least one of in and on the spring device, the resistor element being at least partially interruptible in the event of damage to the spring device; and
    a detection device electrically connected to the resistor element, for detecting an interruption in the resistor element, and for generating a corresponding detection signal.

2. The micromechanical component as recited in claim 1, wherein the first region is a stationary region.

3. The micromechanical component as recited in claim 1, wherein the first region is an elastically deflectable drive region.

4. The micromechanical component as recited in claim 1, wherein the resistor element passes over the first region, so that the resistor element is also interruptible in the event of damage to the first region.

5. The micromechanical component as recited in claim 4, wherein the resistor element meanders over the first region.

6. The micromechanical component as recited in claim 1, wherein the resistor element is connected to the detection device via the first region.

7. The micromechanical component as recited in claim 1, wherein the detection device performs a temperature detection via the resistor element.

8. The micromechanical component as recited in claim 1, wherein the detection device is configured to carry out a detection of light intensity via the resistor element.

9. The micromechanical component as recited in claim 1, wherein:
    the spring device includes at least one of a first section and a second section,
    the resistor element is formed differently in the first section and in the second section, and
    the resistor element is wired to the detection device in such a way that the detection device supplies a first detection signal in the event of an interruption of the resistor element in the first section, and supplies a second detection signal, which is different from the first detection signal, in the event of an interruption in the resistor element in the second section.

10. The micromechanical component as recited in claim 1, wherein the detection device transmits the detection signal wirelessly externally.

11. The micromechanical component as recited in claim 1, wherein the detection device transmits the detection signal wirelessly to a cell phone.

12. A test method for a micromechanical component including at least one first region elastically connected to a second region via a spring device, comprising:
    providing a resistor element situated at least one of in and on the spring device, the resistor element being interruptible in the event of damage to the spring device; and
    performing an electrical detection of an interruption in the resistor element and generating a corresponding detection signal,
    wherein the at least one first region includes at least one of a stationary region and an elastically deflectable drive region and the second region is an elastically deflectable mirror region.

13. The micromechanical component as recited in claim 1, wherein the damage to the spring device includes cracking and/or breakage of the spring device.

14. The test method as recited in claim 12, wherein the damage to the spring device includes cracking and/or breakage of the spring device.

15. The micromechanical component as recited in claim 1, wherein the resistor element passes over the second region, so that the resistor element is also interruptible in the event of damage to the second region.

* * * * *